US012771344B2

(12) United States Patent
Imanishi

(10) Patent No.: US 12,771,344 B2
(45) Date of Patent: Oct. 20, 2026

(54) SEMICONDUCTOR DRIVE DEVICE

(71) Applicant: Mitsubishi Electric Corporation, Tokyo (JP)

(72) Inventor: Motoki Imanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 19/185,495

(22) Filed: Apr. 22, 2025

(65) Prior Publication Data

US 2026/0058653 A1 Feb. 26, 2026

(30) Foreign Application Priority Data

Aug. 26, 2024 (JP) ................................ 2024-144203

(51) Int. Cl.

*H02M 1/088* (2006.01)
*H03K 17/567* (2006.01)
*H03K 17/687* (2006.01)
*H03K 17/691* (2006.01)

(52) U.S. Cl.

CPC ........ *H03K 17/6871* (2013.01); *H02M 1/088* (2013.01); *H03K 17/567* (2013.01); *H03K 17/691* (2013.01)

(58) Field of Classification Search

CPC ...... H02M 1/08; H02M 1/088; H03K 17/567; H03K 17/6871; H03K 17/691
USPC ................ 327/108, 109, 419, 423, 424, 588
See application file for complete search history.

(56) References Cited

U.S. PATENT DOCUMENTS

| | | | | |
|---|---|---|---|---|
| 2009/0230938 | A1 | 9/2009 | Sakurai | |
| 2016/0003887 | A1* | 1/2016 | Nagase | G01R 31/1263 327/546 |
| 2017/0287624 | A1 | 10/2017 | Osada et al. | |
| 2020/0244265 | A1 | 7/2020 | Paganini et al. | |
| 2023/0238964 | A1* | 7/2023 | Tsuji | H03K 17/16 327/581 |
| 2023/0387067 | A1* | 11/2023 | Kinzer | H02M 1/0009 |

FOREIGN PATENT DOCUMENTS

| | | | |
|---|---|---|---|
| JP | 2009-219294 | A | 9/2009 |
| JP | 2016-028407 | A | 2/2016 |
| JP | 2020-120572 | A | 8/2020 |

* cited by examiner

*Primary Examiner* — William Hernandez
(74) *Attorney, Agent, or Firm* — Studebaker Brackett PLLC

(57) ABSTRACT

An object of the present disclosure is to achieve high-speed performance, robustness, and downsizing in a semiconductor drive device including a half-bridge drive circuit. A semiconductor drive device includes: half-bridge drive circuits mounted to a first Si substrate which drives a P-side semiconductor element and an N-side semiconductor element which are totem-pole connected; and signal transmission circuits mounted to a second Si substrate to transmit a drive signal to the half-bridge drive circuits. The P-side half-bridge drive circuit and the N-side half-bridge drive circuit are electrically separated by a high-voltage holding structure on the first Si substrate.

5 Claims, 6 Drawing Sheets

SEMICONDUCTOR DRIVE DEVICE

BACKGROUND

Technical Field

The present disclosure relates to a technique of driving a totem-pole connected power semiconductor element.

Description of the Background Art

Japanese Patent Application Laid-Open No. 2009-219294 discloses a configuration in a half-bridge drive circuit that physical insulation between a transmission circuit and a receiving circuit is performed by a pulse transformer, and a signal is transmitted to a P side at a high-voltage level shifter which is high-voltage separated. A signal from a microcomputer is transmitted to a P-side drive circuit via the physical insulation and the high-voltage level shifter.

SUMMARY

In a case of a half-bridge drive circuit using the physical insulation, a drive device needs to be provided to each of a P side and an N side or a lead frame needs to be separated even in one device. Thus, such a structure interferes with reduction in a size and cost of the device.

Thus, the physically-insulated signal needs to be electrically separated into the N side and the P side to achieve the reduction in the size. However, when the electrical insulation is performed between the N side and the P side, a high-voltage level shifter needs to be used to transmit the signal to the P side, and there is concern in responsiveness of a high-voltage level shift part or robustness by a parasitic operation.

Achieved accordingly a half-bridge drive circuit using physical insulation by transmitting high-speed performance and robustness as an effect of physical insulation using a pulse transformer, for example, as they are to a P-side drive circuit and integrating and downsizing N-side and P-side circuits.

An object of the present disclosure is to achieve high-speed performance, robustness, and downsizing in a semiconductor drive device including a half-bridge drive circuit.

A semiconductor drive device according to the present disclosure includes a half-bridge drive circuit and a signal transmission circuit. The half-bridge drive circuit is mounted to a first Si substrate. The first Si substrate drives a P-side semiconductor element and an N-side semiconductor element which are totem-pole connected. The signal transmission circuit is mounted to a second Si substrate. The signal transmission circuit transmits a P-side drive signal for driving the P-side semiconductor element and an N-side drive signal for driving the N-side semiconductor element to the half-bridge drive circuit. The half-bridge drive circuit includes a P-side half-bridge drive circuit and an N-side half-bridge drive circuit. The P-side half-bridge drive circuit drives the P-side semiconductor element. The N-side half-bridge drive circuit drives the N-side semiconductor element. The signal transmission circuit includes a transmission circuit, a P-side pulse transformer, and an N-side pulse transformer. The transmission circuit transmits the P-side drive signal and the N-side drive signal. The P-side pulse transformer transmits the P-side drive signal transmitted from the transmission circuit to the P-side half-bridge drive circuit. The N-side pulse transformer transmits the N-side drive signal transmitted from the transmission circuit to the N-side half-bridge drive circuit. The P-side half-bridge drive circuit includes a P-side receiving circuit and a P-side drive circuit. The P-side receiving circuit is connected to the P-side pulse transformer by a wire to receive the P-side drive signal from the transmission circuit via the P-side pulse transformer. The P-side drive circuit drives the P-side semiconductor element by the P-side drive signal received by the P-side receiving circuit. The N-side half-bridge drive circuit includes an N-side receiving circuit and an N-side drive circuit. The N-side receiving circuit is connected to the N-side pulse transformer by a wire to receive the N-side drive signal from the transmission circuit via the N-side pulse transformer. The N-side drive circuit drives the N-side semiconductor element by the N-side drive signal received by the N-side receiving circuit. The P-side half-bridge drive circuit and the N-side half-bridge drive circuit are electrically separated by a high-voltage holding structure on the first Si substrate.

The semiconductor drive device according to the present disclosure achieves high-speed performance, robustness, and downsizing.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

A. Premise Technique

Figure 1:
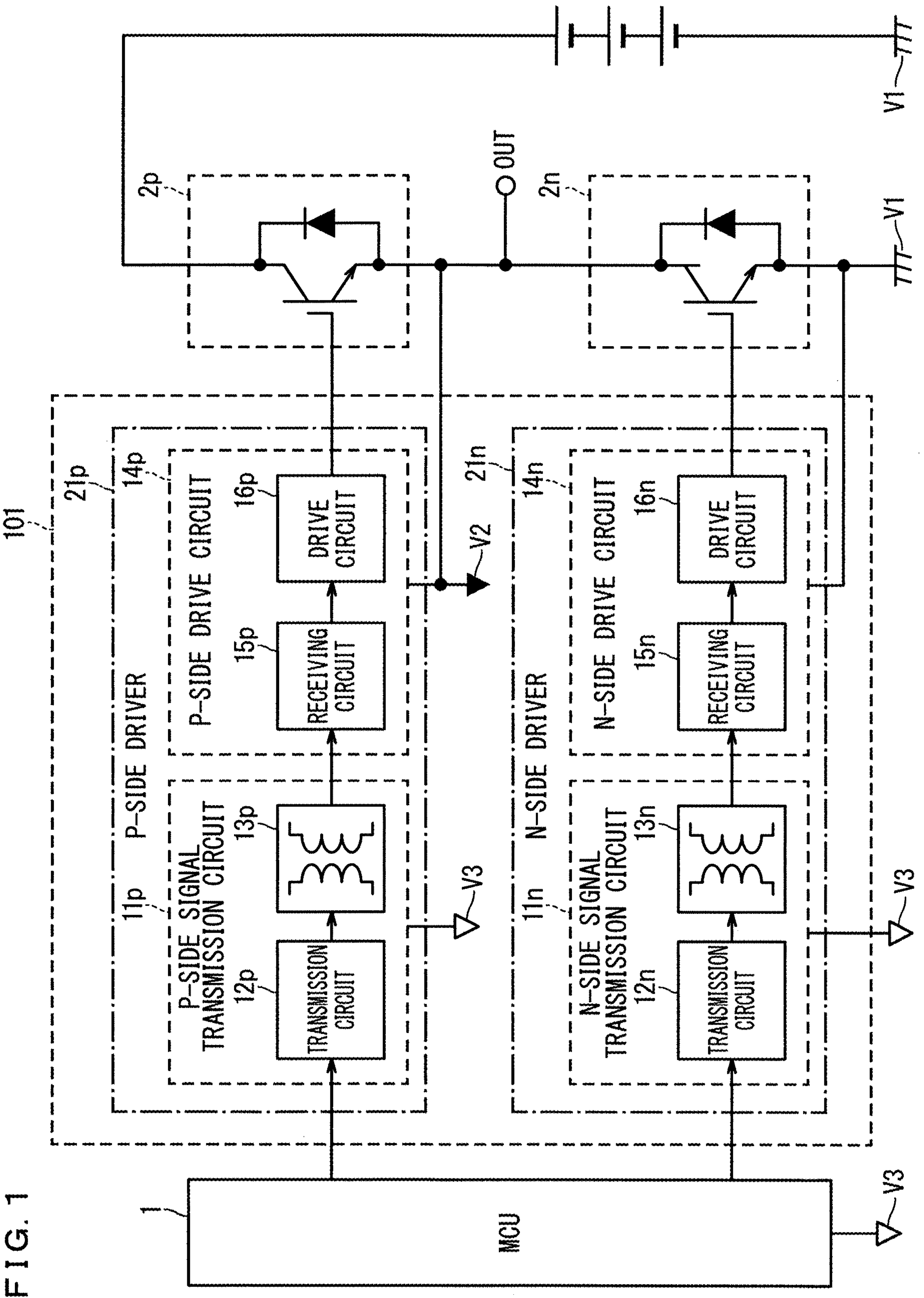
FIG. 1 is a diagram illustrating a configuration of a semiconductor drive device according to a first premise technique.

FIG. 1 illustrates a configuration of a semiconductor drive device 101 according to a first premise technique. Upon receiving a signal from a micro controller unit (MCU) 1, the semiconductor drive device 101 drives power semiconductor elements 2*p* and 2*n*.

The power semiconductor element 2*p* is a P-side power semiconductor element, and the power semiconductor element 2*n* is an N-side power semiconductor element. Each of the power semiconductor elements 2*p* and 2*n* includes an insulated gate bipolar transistor (IGBT) and a diode parallelly connected to the IGBT.

A power source V is disposed between a collector terminal and reference potential V1 of the IGBT constituting the power semiconductor element 2*p*.

An emitter terminal of the IGBT constituting the power semiconductor element 2*n* is connected to the reference potential V1. An emitter terminal of the IG BT constituting the power semiconductor element 2$p$ and a collector terminal of the IGBT constituting the power semiconductor element 2$n$ are connected to each other, and an output terminal OUT is led out of a connection point thereof. In this manner, the power semiconductor elements 2$p$ and 2$n$ are totem-pole connected.

The semiconductor drive device 101 includes a P-side driver 21$p$ and an N-side driver 21$n$. The P-side driver 21$p$ includes a P-side signal transmission circuit lip and a P-side half-bridge drive circuit 14$p$.

The P-side signal transmission circuit lip includes a P-side transmission circuit 12$p$ and a P-side pulse transformer 13$p$.

Upon receiving a signal from the MCU 1 with referential potential V3, the P-side transmission circuit 12$p$ transmits a P-side drive signal for driving the power semiconductor element 2$p$ to the P-side half-bridge drive circuit 14$p$.

The P-side half-bridge drive circuit 14$p$ includes a P-side receiving circuit 15$p$ and a P-side drive circuit 16$p$.

The P-side transmission circuit 12$p$ and the P-side half-bridge drive circuit 14$p$ are physically insulated from each other by the P-side pulse transformer 13$p$. The P-side drive signal with the reference potential V3 transmitted from the P-side transmission circuit 12$p$ is received as the P-side drive signal with reference potential V2 by the P-side receiving circuit 15$p$ via the P-side pulse transformer 13$p$, and is transmitted to the P-side drive circuit 16$p$ from the P-side receiving circuit 15$p$. The P-side drive circuit 16$p$ drives the power semiconductor element 2$p$ by the P-side drive signal with the reference potential V2. V2 is higher than V1.

The N-side driver 21$n$ includes an N-side signal transmission circuit 11$n$ and an N-side half-bridge drive circuit 14$n$.

The N-side signal transmission circuit 11$n$ includes an N-side transmission circuit 12$n$ and an N-side pulse transformer 13$n$.

Upon receiving a signal from the MCU 1 with the reference potential V3, the N-side transmission circuit 12$n$ transmits the N-side drive signal for driving the power semiconductor element 2$n$ to the N-side half-bridge drive circuit 14$n$.

The N-side half-bridge drive circuit 14$n$ includes an N-side receiving circuit 15$n$ and an N-side drive circuit 16$n$.

The N-side transmission circuit 12$n$ and the N-side half-bridge drive circuit 14$n$ are physically insulated from each other by the N-side pulse transformer 13$n$. The N-side drive signal with the reference potential V3 transmitted from the N-side transmission circuit 12$n$ is received as the N-side drive signal with the reference potential V1 by the N-side receiving circuit 15$n$ via the N-side pulse transformer 13$n$, and is transmitted to the N-side drive circuit 16$n$ from the N-side receiving circuit 15$n$. The N-side drive circuit 16$n$ drives the power semiconductor element 2$n$ by the N-side drive signal with the reference potential V1.

Figure 2:
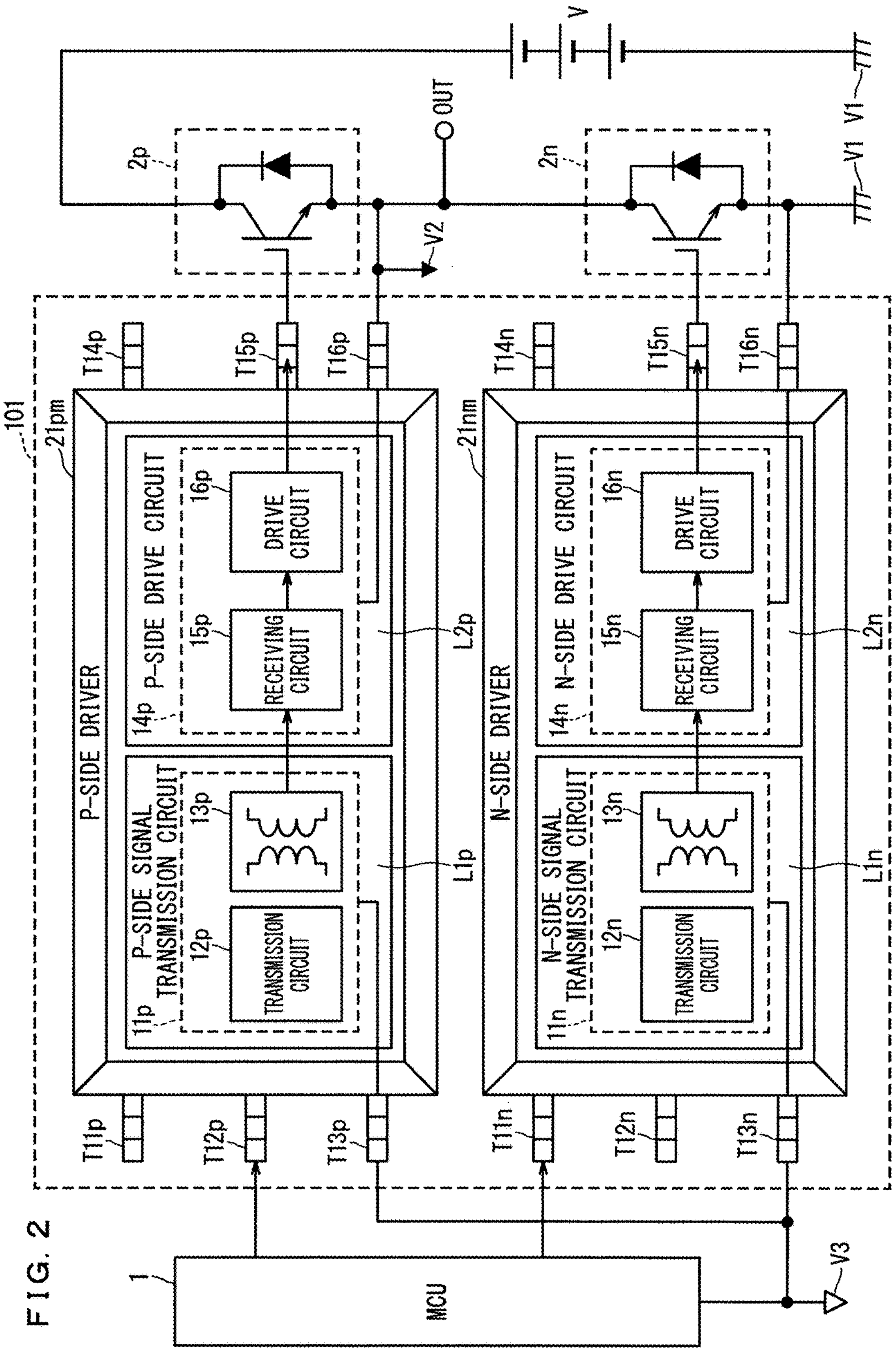
FIG. 2 is a diagram illustrating a package configuration of the semiconductor drive device according to the first premise technique.

FIG. 2 is a diagram illustrating a package configuration of the semiconductor drive device 101. In the semiconductor drive device 101, the N-side driver 21$n$ is constituted as an N-side driver module 21$nm$ different from a P-side driver module 21$pm$ constituting the P-side driver 21$p$.

Terminals T11$n$, T12$n$, T13$n$, T14$n$, T15$n$, and T16$n$ are exposed from a side surface of a package of the N-side driver module 21$nm$. A signal from the MCU 1 is inputted to the terminal T11$n$. The N-side drive signal from the N-side drive circuit 16$n$ is inputted to a gate terminal of the IGBT constituting the power semiconductor element 2$n$ by the terminal T15$n$.

In this manner, in the semiconductor drive device 101 according to the first premise technique, the drive devices, that is the P-side driver 21$p$ and the N-side driver 21$n$ need to be separately provided to the P side and the N side, respectively; thus, there is a problem in reduction of a size and cost.

Figure 3:
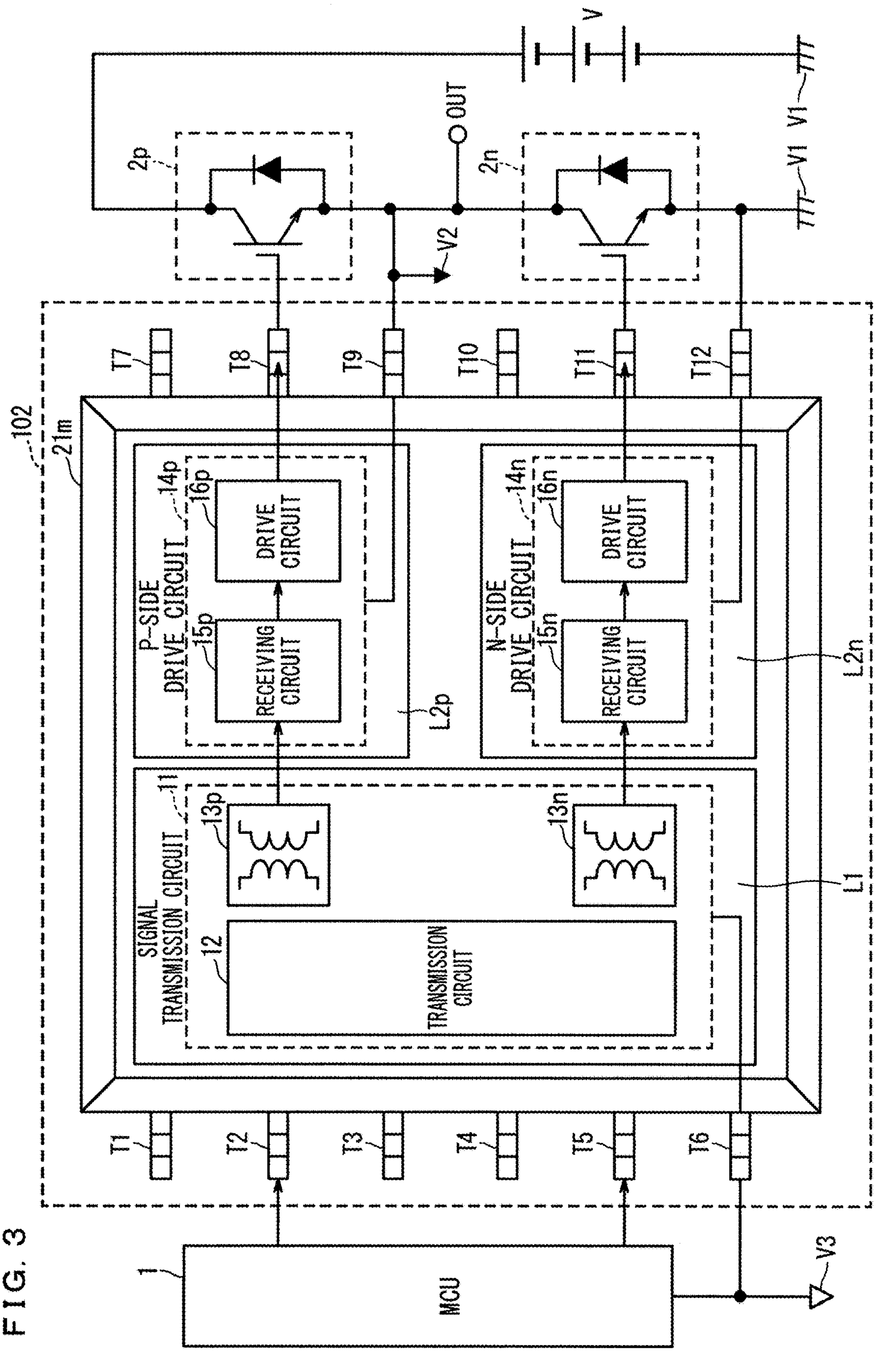
FIG. 3 is a diagram illustrating a package configuration of a semiconductor drive device according to a second premise technique.

FIG. 3 is a diagram illustrating a package configuration of a semiconductor drive device 102 according a second premise technique. A configuration of the semiconductor drive device 102 is described hereinafter. The semiconductor drive device 102 achieves a configuration similar to the semiconductor drive device 101 by one module 21$m$. Although the semiconductor drive device 101 includes two signal transmission circuit, that is the P-side signal transmission circuit lip and the N-side signal transmission circuit 11$n$, semiconductor drive device 102 includes one signal transmission circuit 11.

The signal transmission circuit 11 includes a transmission circuit 12, a P-side pulse transformer 13$p$, and an N-side pulse transformer 13$n$.

Upon receiving a signal from the MCU 1 with the reference potential V3, the transmission circuit 12 transmits the N-side drive signal for driving the power semiconductor element 2$n$ and the P-side drive signal for driving the power semiconductor element 2$p$.

The transmission circuit 12 and the P-side half-bridge drive circuit 14$p$ are physically insulated from each other by the P-side pulse transformer 13$p$. The P-side drive signal with the reference potential V3 transmitted from the transmission circuit 12 is received as the P-side drive signal with the reference potential V2 by the P-side receiving circuit 15$p$ via the P-side pulse transformer 13$p$, and is transmitted to the P-side drive circuit 16$p$ from the P-side receiving circuit 15$p$. The P-side drive circuit 16$p$ drives the power semiconductor element 2$p$ by the P-side drive signal with the reference potential V2. V2 is higher than V1.

The transmission circuit 12 and the N-side half-bridge drive circuit 14$n$ are physically insulated from each other by the N-side pulse transformer 13$n$. The N-side drive signal with the reference potential V3 transmitted from the transmission circuit 12 is received as the N-side drive signal with the reference potential V1 by the N-side receiving circuit 15$n$ via the N-side pulse transformer 13$n$, and is transmitted to the N-side drive circuit 16$n$ from the N-side receiving circuit 15$n$. The N-side drive circuit 16$n$ drives the power semiconductor element 2$n$ by the N-side drive signal with the reference potential V1.

The signal transmission circuit 11 is mounted to a lead frame L1. The P-side half-bridge drive circuit 14$p$ is mounted to a lead frame L2$p$. The N-side half-bridge drive circuit 14$n$ is mounted to a lead frame L2$n$.

Terminals T1, T2, T3, T4, T5, T6, T7, T8, T9, T10, T11, and T12 are exposed from a side surface of the module 21$m$. A signal from the MCU 1 is inputted to the terminal T2. The P-side drive signal from the P-side drive circuit 16$p$ is inputted to a gate terminal of the IG BT constituting the power semiconductor element 2$p$ by the terminal T8. The N-side drive signal from the N-side drive circuit 16$n$ is inputted to a gate terminal of the IG BT constituting the power semiconductor element 2$n$ by the terminal T11.

In the semiconductor drive device 102 according to the second premise technique, the signal transmission circuit 11, the P-side half-bridge drive circuit 14$p$, and the N-side half-bridge drive circuit 14$n$ can be achieved by one module 21$m$. However, the P-side half-bridge drive circuit 14$p$ and the N-side half-bridge drive circuit 14$n$ need to be mounted to different lead frames in the module 21*m*; thus, there is a problem in reduction of the size and cost.

B. Embodiment 1

Thus, in the semiconductor drive device according to the embodiment 1 hereinafter, the P-side half-bridge drive circuit and the N-side half-bridge drive circuit are integrated on one lead frame. Downsizing of the semiconductor drive device is achieved while ensured are high-speed performance and robustness as effects of physical insulation using the pulse transformer.

Figure 4:
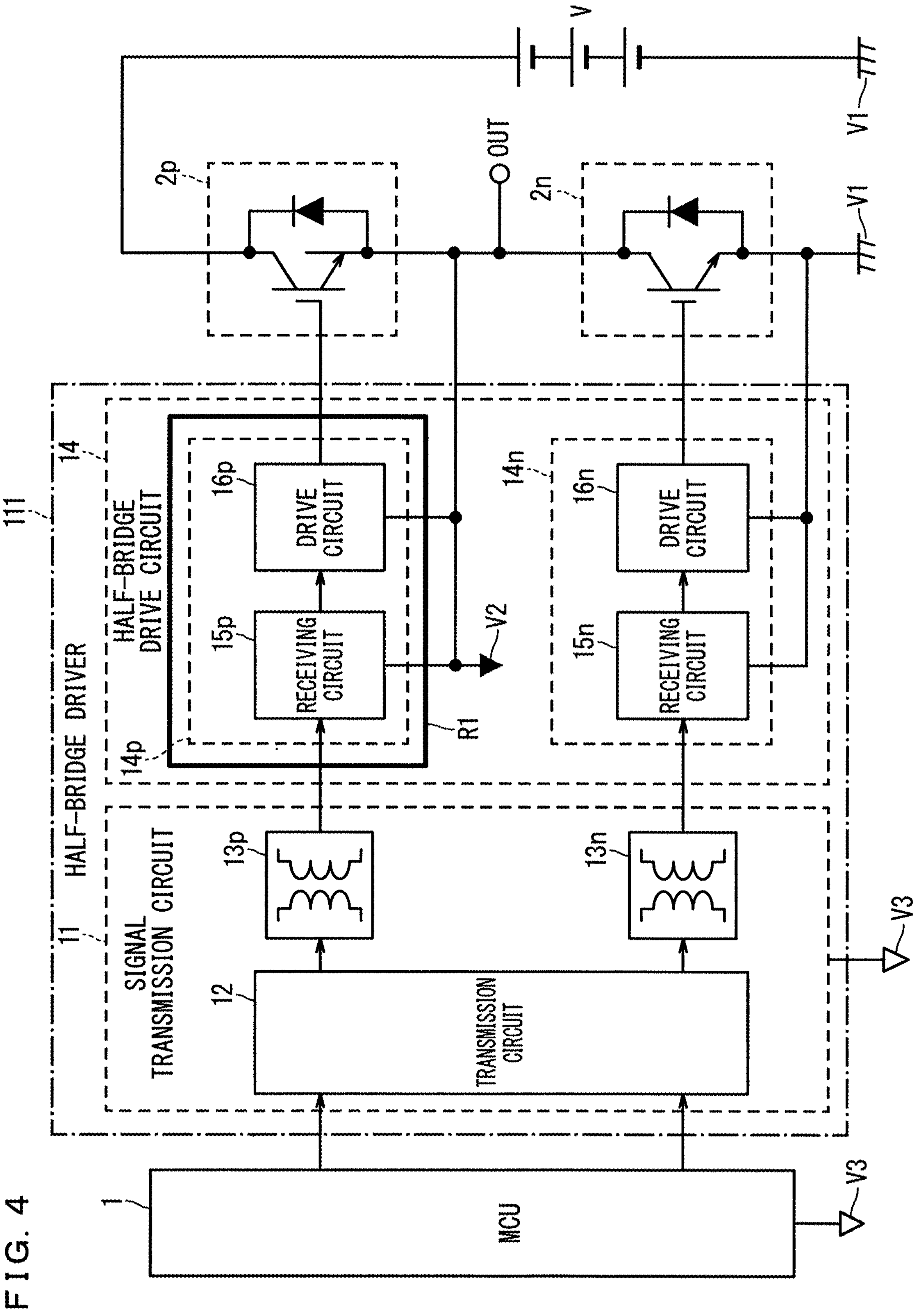
FIG. 4 is a diagram illustrating a configuration of a semiconductor drive device according to an embodiment 1.

FIG. 4 is a configuration of a semiconductor drive device 111 according to the embodiment 1. The semiconductor drive device 111 is different from the semiconductor drive device 102 according to the second premise technique in that the P-side half-bridge drive circuit 14*p* and the N-side half-bridge drive circuit 14*n* are electrically insulated from each other by a high-voltage holding structure R1 in the half-bridge drive circuit 14. The high-voltage holding structure R1 may be a high-voltage RESURF structure using pn junction or a structure using dielectric isolation.

Figure 5:
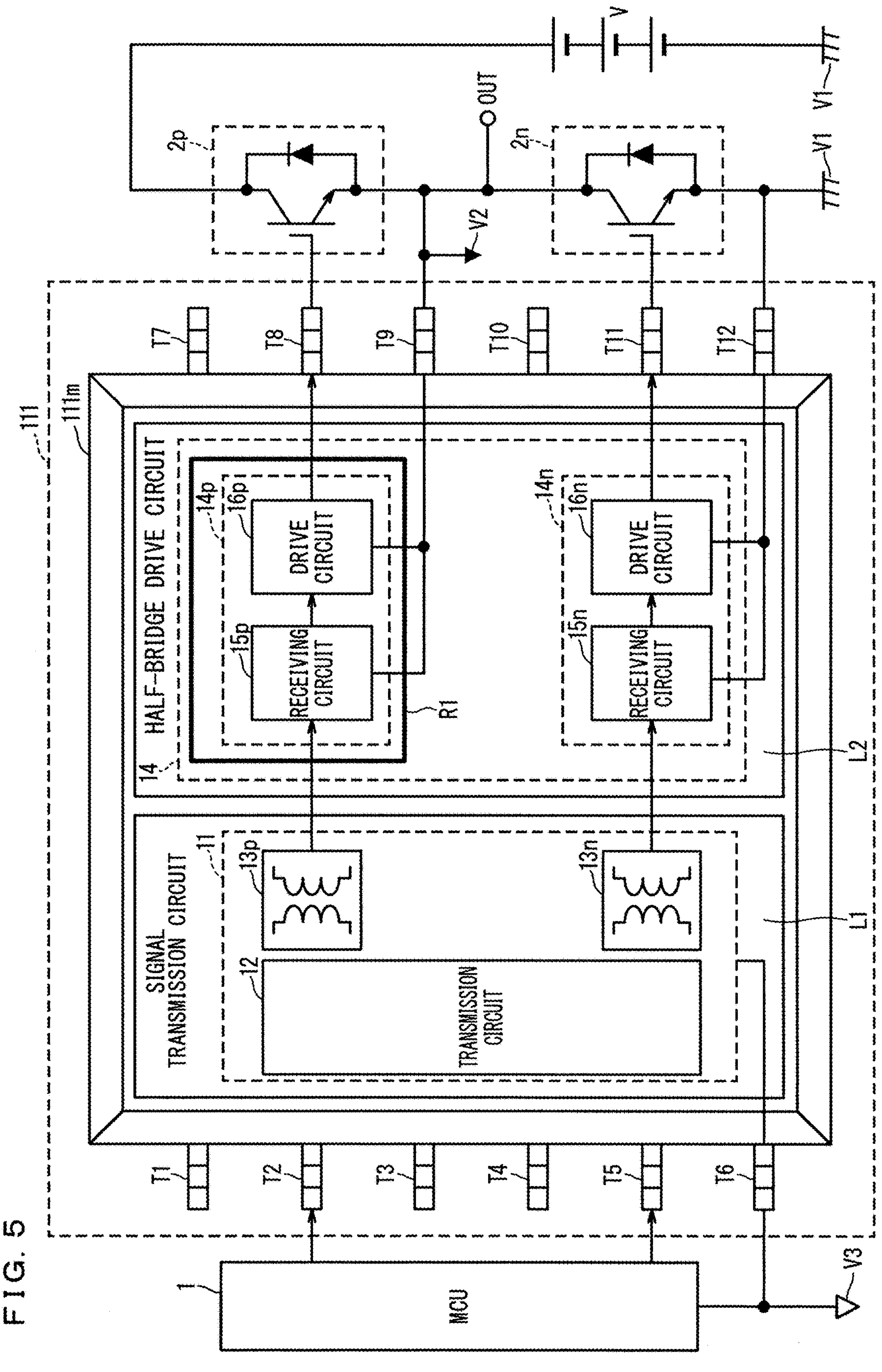
FIG. 5 is a diagram illustrating a package configuration of the semiconductor drive device according to the embodiment 1.

FIG. 5 is a diagram illustrating a package configuration of the semiconductor drive device 111 according to the embodiment 1.

The signal transmission circuit 11 is mounted to the lead frame L1, and the half-bridge drive circuit 14 is mounted to a lead frame L2. The lead frame L1 and the lead frame L3 are physically insulated from each other. When the signal transmission circuit 11 and the half-bridge drive circuit 14 of the semiconductor drive device 111 are constituted in the same package 111*m*, the lead frame L1 and the lead frame L2 are physically insulated from each other by resin having high insulation properties.

Figure 6:
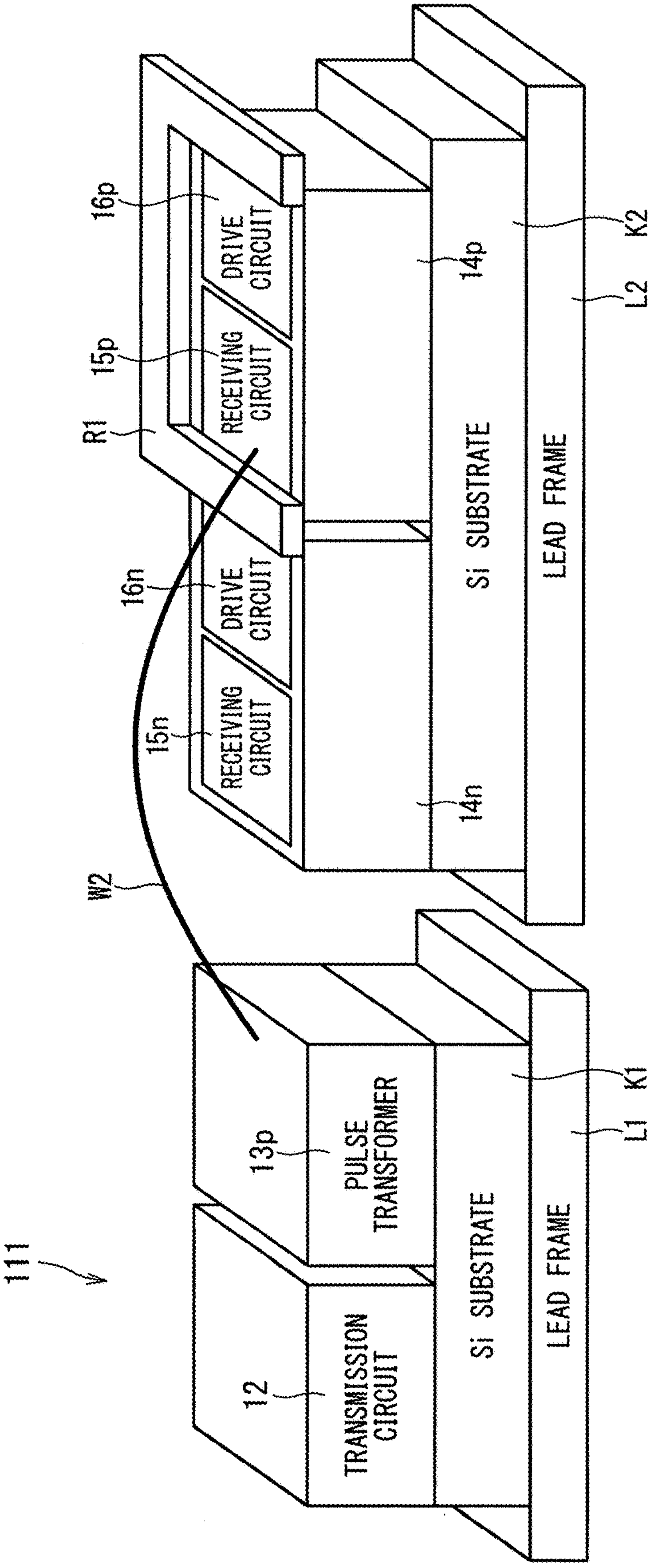
FIG. 6 is a diagram illustrating a configuration on a lead frame in the semiconductor drive device according to the embodiment 1.

FIG. 6 is a configuration on the lead frame L1 and the lead frame L2 in the semiconductor drive device 111 according to the embodiment 1.

A silicon (Si) substrate K1 is provided on the lead frame L1. The transmission circuit 12, the P-side pulse transformer 13*p*, and the N-side pulse transformer 13*n* are mounted on the Si substrate K1. Illustration of the N-side pulse transformer 13*n* is omitted in FIG. 6.

A silicon (Si) substrate K2 as a substrate different from the Si substrate K1 is provided on the lead frame L2. The Si substrate K2 is also referred to as the first Si substrate, and the Si substrate K1 is also referred to as the second Si substrate. The N-side half-bridge drive circuit 14*n* and the P-side half-bridge drive circuit 14*p* are mounted on the Si substrate K2. However, the N-side half-bridge drive circuit 14*n* and the P-side half-bridge drive circuit 14*p* are electrically insulated from each other by the high-voltage holding structure R1.

The P-side pulse transformer 13*p* and the P-side receiving circuit 15*p* are directly connected to each other by a wire W2, and the P-side drive signal is transmitted through this path. In this manner, the high voltage level shifter is not used for transmitting the P-side drive signal. A gold wire, an aluminum wire, or a copper wire is used for the wire W2.

The N-side pulse transformer 13*n* and the P-side pulse transformer 13*p* may be capacitors performing capacitive coupling or photocouplers performing optical coupling.

In the semiconductor drive device 111 according to the embodiment 1, the P-side half-bridge drive circuit 14*p* and the N-side half-bridge drive circuit 14*n* are integrated on one lead frame L2. Thus, downsizing of the semiconductor drive device 111 is achieved while ensured are high-speed performance and robustness as effects of physical insulation using the N-side pulse transformer 13*n* and the P-side pulse transformer 13*p*.

While the embodiments etc. have been shown and described in detail, the above embodiments are not restrictive. Various modifications and replacements can be added to the above embodiments without departing from the scope of claims.

The aspects of the present disclosure are collectively described hereinafter as appendixes.

Appendix 1

A semiconductor drive device, comprising:
- a half-bridge drive circuit mounted to a first Si substrate which drives a P-side semiconductor element and an N-side semiconductor element which are totem-pole connected; and
- a signal transmission circuit mounted to a second Si substrate to transmit a P-side drive signal for driving the P-side semiconductor element and an N-side drive signal for driving the N-side semiconductor element to the half-bridge drive circuit, wherein the half-bridge drive circuit includes:
- a P-side half-bridge drive circuit driving the P-side semiconductor element; and
- an N-side half-bridge drive circuit driving the N-side semiconductor element, the signal transmission circuit includes:
- a transmission circuit transmitting the P-side drive signal and the N-side drive signal;
- a P-side pulse transformer transmitting the P-side drive signal transmitted from the transmission circuit to the P-side half-bridge drive circuit; and
- the N-side pulse transformer transmitting the N-side drive signal transmitted from the transmission circuit to the N-side half-bridge drive circuit, the P-side half-bridge drive circuit includes:
- a P-side receiving circuit connected to the P-side pulse transformer by a wire to receive the P-side drive signal from the transmission circuit via the P-side pulse transformer; and
- a P-side drive circuit driving the P-side semiconductor element by the P-side drive signal received by the P-side receiving circuit, the N-side half-bridge drive circuit includes:
- an N-side receiving circuit connected to the N-side pulse transformer by a wire to receive the N-side drive signal from the transmission circuit via the N-side pulse transformer; and
- an N-side drive circuit driving the N-side semiconductor element by the N-side drive signal received by the N-side receiving circuit, and
- the P-side half-bridge drive circuit and the N-side half-bridge drive circuit are electrically separated by a high-voltage holding structure on the first Si substrate.

Appendix 2

The semiconductor drive device according to Appendix 1, wherein
- the high-voltage holding structure is a high-voltage RESURF structure using pn junction.

Appendix 3

The semiconductor drive device according to Appendix 1, wherein the high-voltage holding structure is a structure using dielectric isolation.

Appendix 4

The semiconductor drive device according to any one of Appendixes 1 to 3, wherein the P-side pulse transformer and the N-side pulse transformer have a capacitive coupling system by capacitors.

Appendix 5

The semiconductor drive device according to any one of Appendixes 1 to 3, wherein the P-side pulse transformer and the N-side pulse transformer have an optical coupling system by photocouplers.

While the disclosure has been shown and described in detail, the foregoing description is in all aspects illustrative and not restrictive. It is therefore understood that numerous modifications and variations can be devised.

What is claimed is:

1. A semiconductor drive device, comprising:

a half-bridge drive circuit mounted to a first Si substrate which drives a P-side semiconductor element and an N-side semiconductor element which are totem-pole connected; and a signal transmission circuit mounted to a second Si substrate to transmit a P-side drive signal for driving the P-side semiconductor element and an N-side drive signal for driving the N-side semiconductor element via the half-bridge drive circuit, wherein the half-bridge drive circuit includes:

a P-side half-bridge drive circuit driving the P-side semiconductor element; and an N-side half-bridge drive circuit driving the N-side semiconductor element, the signal transmission circuit includes:

a transmission circuit transmitting the P-side drive signal and the N-side drive signal;

a P-side pulse transformer transmitting the P-side drive signal transmitted from the transmission circuit to the P-side half-bridge drive circuit; and an N-side pulse transformer transmitting the N-side drive signal transmitted from the transmission circuit to the N-side half-bridge drive circuit, the P-side half-bridge drive circuit includes:

a P-side receiving circuit connected to the P-side pulse transformer by a wire to receive the P-side drive signal from the transmission circuit via the P-side pulse transformer; and a P-side drive circuit driving the P-side semiconductor element by the P-side drive signal received by the P-side receiving circuit, the N-side half-bridge drive circuit includes:

an N-side receiving circuit connected to the N-side pulse transformer by a wire to receive the N-side drive signal from the transmission circuit via the N-side pulse transformer; and an N-side drive circuit driving the N-side semiconductor element by the N-side drive signal received by the N-side receiving circuit, and the P-side half-bridge drive circuit and the N-side half-bridge drive circuit are electrically separated by a high-voltage holding structure on the first Si substrate.

2. The semiconductor drive device according to claim 1, wherein the high-voltage holding structure is a high-voltage RESURF structure using pn junction.

3. The semiconductor drive device according to claim 1, wherein the high-voltage holding structure is a structure using dielectric isolation.

4. The semiconductor drive device according to claim 1, wherein the P-side pulse transformer and the N-side pulse transformer have a capacitive coupling system by capacitors.

5. The semiconductor drive device according to claim 1, wherein the P-side pulse transformer and the N-side pulse transformer have an optical coupling system by photocouplers.

* * * * *